(12) United States Patent
Nguyen et al.

(10) Patent No.: US 6,655,854 B1
(45) Date of Patent: Dec. 2, 2003

(54) OPTOELECTRONIC PACKAGE WITH DAM STRUCTURE TO PROVIDE FIBER STANDOFF

(75) Inventors: Luu Thanh Nguyen, Sunnyvale, CA (US); Ken Pham, San Jose, CA (US); Peter Deane, Los Altos, CA (US); William Paul Mazotti, San Martin, CA (US); Bruce Carlton Roberts, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 281 days.

(21) Appl. No.: 09/922,357

(22) Filed: Aug. 3, 2001

(51) Int. Cl.⁷ .............................. G02B 6/36; H01L 21/00
(52) U.S. Cl. ............................ 385/88; 385/49; 385/92; 438/26; 438/27; 438/29
(58) Field of Search ........................... 385/88, 89, 92, 385/94, 49; 438/26, 27, 29, 31

(56) References Cited

U.S. PATENT DOCUMENTS

| | | | |
|---|---|---|---|
| 4,222,629 A | 9/1980 | Dassele et al. ........... 385/88 X |
| 4,241,978 A | 12/1980 | Dubois et al. ........... 385/88 X |
| 4,346,294 A | 8/1982 | Albaugh et al. ....... 250/227.11 |
| 4,927,228 A | 5/1990 | Van De Pas ............. 385/88 X |
| 4,979,791 A | 12/1990 | Bowen et al. ........... 385/88 X |
| 5,386,488 A | 1/1995 | Oikawa ....................... 385/92 |
| 5,499,312 A | 3/1996 | Hahn et al. .................. 385/91 |
| 5,515,467 A | * 5/1996 | Webb ......................... 385/88 |
| 5,515,468 A | 5/1996 | DeAndrea et al. ............ 385/88 |
| 5,590,232 A | * 12/1996 | Wentworth et al. ........... 385/92 |
| 5,631,987 A | * 5/1997 | Lasky et al. ................. 385/88 |
| 5,857,050 A | * 1/1999 | Jiang et al. .................. 385/92 |
| 6,364,542 B1 | * 4/2002 | Deane et al. ................ 385/92 |

FOREIGN PATENT DOCUMENTS

GB          2276033 A          9/1994          ............ 385/14 X

OTHER PUBLICATIONS

Fairchild et al., "Optical Devices Engaged to Fibers . . . ", U.S. patent application Publication No. U.S. 2002/0114566A1, published Aug. 22, 2002.*

Cayrefourcq et al., "Passive Alignment Using Slanted Wall Pedestal", U.S. patent application Publication No. U.S. 2001/0010743 A1, published Aug. 2, 2001.*

* cited by examiner

*Primary Examiner*—Brian Healy
(74) *Attorney, Agent, or Firm*—Beyer Weaver & Thomas, LLP

(57) ABSTRACT

An optoelectronic component is described that includes a photonic device carried by a base substrate. A dam structure is formed on the base substrate by dispensing and hardening a precise amount of a flowable material. The dam structure is sized to define a desired standoff between an optical fiber and an active facet on the photonic device. In embodiments where the photonic device is wire bonded to the base substrate, it may be desirable to provide a reverse wire bond in order to permit the optical fiber to be placed closer to the photonic device. In some embodiments, the base substrate takes the form of a flexible material having electrically conductive traces thereon that are electrically connected to the photonic device. An optical component support block may be provided to support the flex material. In some implementations, a semiconductor die may be directly soldered to the traces on the flexible material.

34 Claims, 3 Drawing Sheets

OPTOELECTRONIC PACKAGE WITH DAM STRUCTURE TO PROVIDE FIBER STANDOFF

CROSS REFERENCE TO RELATED APPLICATIONS

The present application is related to concurrently filed, co-pending application Ser. Nos. 09/957,936, pending 09/922,946, pending each of which are incorporated herein by reference.

BACKGROUND OF THE INVENTION

The present inventions relate generally to mechanisms for controlling the standoff distance between an optical fiber and a photonic device in an optoelectronic package. More particularly, a dam structure that defines the standoff distance between the photonic device and the optical fiber(s) is described.

Optical networks have a wide variety of applications and are, for example, widely used within the telecommunications, data transmission and high speed networking industries. The optical devices used to convert electrical signals into light signals and light signals into electrical signals are key components in any such optical network. Generally, such devices include one or more photonic elements (e.g. detectors and/or laser emitters) together with the electronic circuitry necessary to drive the photonic elements (e.g., receiver, transmitter or transceiver circuitry). Although a wide variety of optical transceiver devices are currently commercially available, there are always continuing efforts to improve their design and functionality as well as to lower their production costs.

One issue that is fundamental to the design of any photonic device is the desire to (relatively) efficiently optically couple each active facet (i.e., emitter or detector) to its associated optical fiber. The coupled power on launch (lasing) must be enough to supply the complete link—with the detector receiving enough power to resolve a signal, but not so high that laser safety is compromised. It is often considered desirable to place the optical fiber as close as possible to the active region (facet) of the photonic device. However, there are often practical limits to this. By way of example, in some devices, there is a concern that if the optical fiber physically contacts the photonic element, it may cause physical damage to the photonic device. Further, in some devices, the photonic device is electrically connected to a substrate by wire bonding and placing the optical fiber too close to the photonic device may risk damaging the bonding wires. Therefore, it is common in today's implementation schemes to maintain a relatively large standoff distance between a photonic device and its associated optical fiber(s). By way of example, standoff distances on the order of 1 to 5 millimeters are typical in commercial systems that are presently available. At these distances, it becomes important to collimate the optical fibers to insure good optical coupling between the fibers and the photonic elements. Typically collimation is accomplished by providing a simple lens at the termination of the optical fiber at emitter or detector active regions, or both One approach to maintaining a close coupling between the photonic device and the optical fiber is to control the standoff distance between the two components. This can be done, by placing a spacer on the base that supports the photonic device. Although the use of a spacer has significant appeal (and indeed the approach can be used with success), there are some practical drawbacks to this approach. Most notably, it can be difficult to provide precise quality control of the standoff distance.

When an integrated circuit wafer is fabricated, it will have a designated nominal thickness. However, as a practical matter there tend to be thickness variations between different photonic wafers, which results in thickness variations in their respective dice. More particularly, photonic wafers are typically background to a desired thickness. However, the typical grinding process is accurate only to within about 0.5 mil (13 microns) of the targeted thickness. Thus, different wafers may have different thickness, and mixing dice from these wafers will potentially impact the ability to accurately obtain the desired fiber standoff. Therefore, in a transceiver configuration, detector and laser die must be pre-measured for thickness 'pairing'. Similarly, when a spacer is fabricated, there are spacer production tolerances as well (although the spacer production tolerances tend to vary less than the wafer thickness). If the die thickness varies too much, there may be production problems using a spacer to provide the desired standoff between the die and optical fiber. For example, if the die is too thin relative to the spacer, then the gap between the fiber and the active facet may be farther than desired which reduces optical coupling. Alternatively, if the die is too thick relative to the spacer, then the gap is too small which may result in mechanical damage during the assembly process. One approach to addressing these tolerance problems is to sort and match the dice and spacers to provide the desired standoff.

Although the described systems for controlling standoff work well, they are relatively expensive to produce. Sorting and matching die thickness can be quite time consuming, costly, and can present real logistical issues in terms of binning the die inventory. Accordingly, there are continuing efforts to provide improved optical component packaging techniques that help reduce the size and costs of the optical components.

SUMMARY OF THE INVENTION

To achieve the foregoing and other objects and in accordance with the purpose of the present invention, an optoelectronic component is described that includes a photonic device carried by a base substrate. A dam structure is formed on the base substrate by dispensing and hardening a precise amount of a flowable material. The dam structure is sized to define a desired standoff between an optical fiber and an active facet on the photonic device.

In various embodiments, it may be desirable to provide a plurality of dam structures. In some preferred embodiments, the dam structure(s) is formed from an epoxy based material.

In some embodiments, the base substrate takes the form of a flexible material having electrically conductive traces thereon that are electrically connected to the photonic device. An optical component support block may be provided to support the flex material. In some implementations, a semiconductor die may be directly soldered to the traces on the flexible material. In other implementations, the base substrate is a ceramic form printed with electrically conductive traces.

In embodiments where the photonic device is wire bonded to the base substrate, it may be desirable to provide a reverse wire bond in order to permit the optical fiber to be placed closer to the photonic device.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

As suggested in the background, in optoelectronic devices, it is generally perceived as desirable to provide a close coupling between the optical transmission line (e.g. optical fiber) and the active facet of a photonic device that optically communicates with the optical fiber, systematically optimizing coupling power within safety constraints. It is generally known that if the optical fiber can be held close enough to the active facet, it is possible to eliminate the need for a collimating lens altogether. However achieving such close coupling in an economical manner has posed some difficulties. The drawings and the description below illustrate a packaging approach that can help facilitate close optical coupling between photonic devices and their associated fibers.

Figure 1:
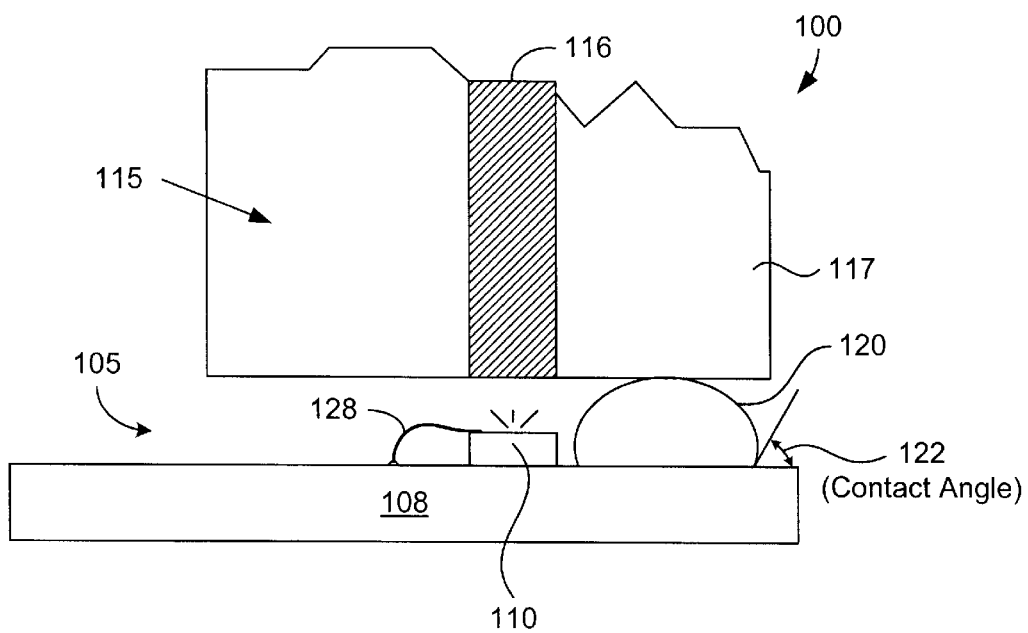
FIG. 1 is a diagrammatic cross sectional side view of the optical interface region of a optoelectronic component in accordance with one embodiment of the invention.

Referring next to FIG. 1, the optical interface region 105 of an optoelectronic package 100 formed in accordance with one embodiment of the invention will be described. In the illustrated embodiment, a photonic device die 110 is mounted and electrically connected to a substrate 108 such that the active facet (active region) of the photonic device 110 is exposed outward toward an optical fiber 115. A dam 120 is formed on the substrate to serve as a registration surface for the optical fiber. During assembly, a fiber termination or a cladding portion of the optical fiber 115 is brought into contact with the dam 120 so that the dam effectively defines the standoff distance between the substrate 108 and the facet of the photonic device 110.

The dam 120 is formed by dispensing a precise volume of a hardenable liquid or low viscosity material. As will be appreciated by those familiar precision dispensing, with the proper selection of materials, the surface tension of the dispensed fluid can be relied upon to cause the dispensed droplet to assume a very predictable shape (including height) based upon the volume of fluid dispensed. Thus, the height of the drop can be accurately controlled by precisely controlling the volume of the fluid dispensed. A wide variety of micro-dispensers that are well suited for such precision dispensing are commercially available.

As described above in the discussion of the use of spacers to control the optical fiber standoff height, one problem that can occur is that wafer production (or when appropriate packaging) variations can have significant impacts on the resultant standoff. These standoff variations can have negative impacts on the optical coupling achieved. With the dam dispensing approach just described, these variations can be largely compensated for by simply measuring the actual height of the die surface relative to the substrate 108. The desired height of the dam 120 can then be determined and the appropriate volume of the fluid material dispensed can be precisely controlled to achieve the desired bead height. Thus, the standoff height can be very precisely controlled by effectively building a dam that is sized appropriately for the specific application. Of course, if the height of a batch of dice is known to be the same, it may be possible to select the appropriate dam volume for the batch without necessarily measuring every unit. However, with the use of automatic auto-focusing vision systems, the dynamic measurement of the mounted die height can easily be made and is therefore preferred. More specifically, the vision system can be programmed to automatically focus on a reference (a.k.a. fiducial point) on the base substrate and refocus on a fiducial point on the photonic device. The effective thickness of the die and the adhesive used to attach the die can be automatically determined using these measurements, which facilitates the calculation of the required volume of material to be dispensed.

The term "dam" structure has been used to refer to the dispensed and hardened structure, which serves as the registration surface for the optical fiber. The shape of the dam may be widely varied. In the illustrated embodiment, the dam is somewhat ball shaped. However, the dispensed droplet can take a wide variety of forms. By way of example, elongated and other shaped dam structures can be used as well. Alternatively, the dam 120 may be configured to extend partially or completely around the photonic device 110. The dam may also be arranged to create an angle to minimize back reflectance as described in concurrently filed, co-pending application Ser. No. 09/922,946, pending.

The substrate 108 has conductive traces (not shown) thereon. The photonic device may be electrically coupled to the conductive traces by any suitable connection technique. In the embodiment shown the photonic device has a common cathode that is located on the back surface of the die. This common cathode is directly soldered to its associated conductive trace. Bonding wire 128 is used to electrically couple the anode of the active regions (which is located on the top surface of the die) to its associated conductive trace. However, it should be appreciated that a wide variety of other suitable connection techniques, including (but not limited to) TAB, direct soldering (e.g. "flip chip" type mounting), and conventional package mounting techniques (e.g. soldering, pins, etc.) can readily be used in particular implementations. It should be appreciated that it is generally desirable to bring the optical fiber as close as practical to the active facet of the photonic device without causing damage. When wire bonding is used, the loop height of the bonding wire may interfere with this approach. In order to help reduce the loop height of the bonding wire, a reverse wire bond may optionally be used. In this approach the bonding wire 128 is ball bonded to the substrate and stitch bonded to a bond pad on the photonic device (or to a conductive bump formed on the bond pad).

A variety of materials can be used as the hardenable dam material. By way of example, epoxy and epoxy like materials work particularly well and are commonly used in semiconductor packaging. Alternatively, silicone gel may also be used to form the dam. The specific materials used to form the dam may be widely varied based on a variety of factors including the nature of the substrate used. In order to provide the best results, material selection and compatibility is quite important. Generally, a very small contact angle 122

(which is indicative of good wetting) between the substrate and the dam material is undesirable since the resin may flow uncontrollably. Very high contact angles, (which is indicative of relatively poor wetting) may also have problems since they tend to be indicative of worse adhesive strength which may present long-term reliability issues. By way of example, contact angles in the range of 30 to 60 degrees are currently perceived to be preferable since they tend to balance dam geometry control and adhesion. However, when different materials are used, contact angles outside that range may well work fine.

Figure 2:
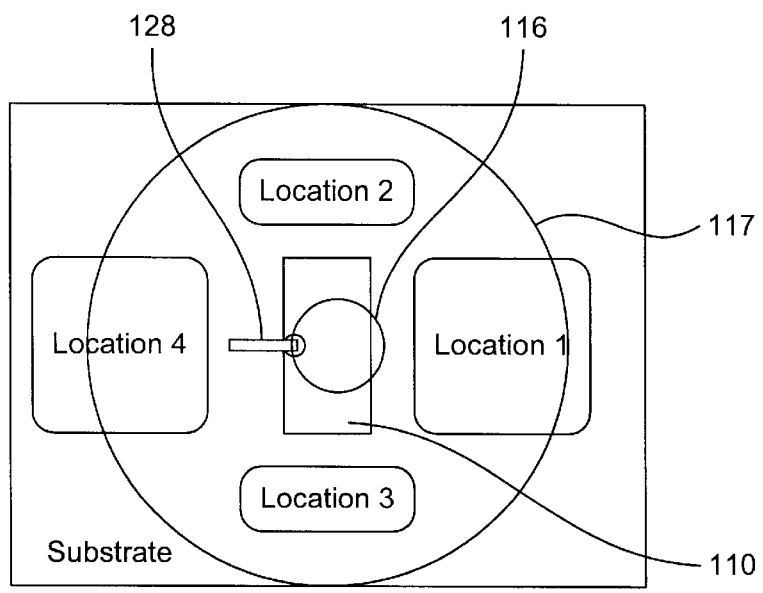
FIG. 2 is a top view illustrating a few potential locations for dam structures on a substrate.

In the illustrated embodiment, a single dam 120 is provided. However, in alternative embodiments multiple dams may be provided. The dam or dams may be positioned at a variety of locations relative to the die. By way of example, several suitable dam locations are illustrated in FIG. 2. As seen therein, the dam may be located along any side of the die so long as it does not interfere with the bond wires 128 or other features of the device. Of course, the suitable dam locations are not limited to those shown. In the drawing of FIG. 2, the dam is arranged to engage a section of the cladding portion of the optical fiber. In other embodiments, the dam can be arranged to engage a fiber termination or ferrule that holds the optical fiber. In FIG. 2, the center circle is intended to illustrate a representative positioning of a core portion 116 of the optical fiber and the outer circle is intended to illustrate a representative positioning of the cladding 117. Generally it is desirable to insure that the dam does not cover any portion of the core of the optical fiber since that would interfere with the optical coupling between the optical fiber 115 and the photonic device 110.

It should be appreciated that the dam positions illustrated in FIG. 2 are by no means exhaustive. As suggested above, geometry and/or location of the dam structure(s) may be widely varied. By way of example, the dam 120 may be configured to extend partially or completely around the photonic device 110.

In the illustrated embodiment, the distal tip of the optical fiber is a flat surface. As will be appreciated by those familiar with the art, in some applications a portion of the distal tip of the optical fiber is chamfered. This is done to reduce optical interference from back reflections. In embodiments that include a chamfered tip, the dam can be arranged to engage a flat portion of the cladding, the chamfered portion of the cladding or a fiber termination that supports the optical fiber. In other embodiments, the dam may be tapered or otherwise constructed to position the optical fibers at an angle relative to the surface of the photonic device to minimize back reflectance as described in concurrently filed, co-pending application Ser. No. 09/922,946, pending.

Figure 3:
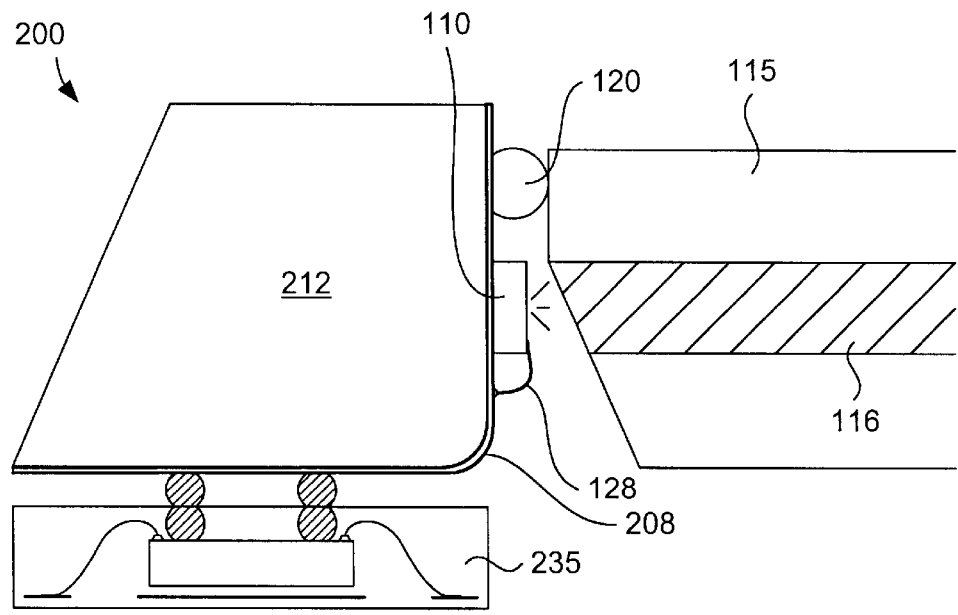
FIG. 3 is a diagrammatic cross sectional side view of a packaged optoelectronic component in accordance with another embodiment of the invention.

Referring next to FIG. 3, an optoelectronic package 200 in accordance with another embodiment of the invention will be described. In the illustrated embodiment, a flexible substrate material 208 having conductive traces (not shown) thereon is supported by an optical base 212. This structure is described in more detail in co-pending application Ser. No. 10/165,553, pending, which is incorporated herein by reference. By way of example, the flexible substrate can take the form of conventional flex printed circuit cabling. A photonic device (die) 110 is mounted and electrically connected to the flexible substrate 208 such that the facet (active region) of the photonic device is exposed outward towards the optical fiber 115. The optical interface region 105 in this embodiment may take a form similar to the interface region 105 illustrated in FIG. 1. In this example, one or more bond pads on the die are electrically coupled to one end of the flexible substrate. The flexible substrate is wrapped around one corner of the optical base 212 and is electrically coupled to a separate chip 235 that includes suitable circuitry (i.e., receiver, transmitter or transceiver circuitry) to drive the photonic device 110. Of course, the design and packaging of the integrated circuit 235 may be widely varied, including but not limited to ceramic substrates employing printed circuitry In the illustrated embodiment, the integrated circuit 235 is packaged in a leadless leadframe package (LLP) format that includes contacts on a top surface that are electrically coupled to the flexible substrate. The bottom surface of the package has standard LLP contacts. These structures are described in more detail in co-pending application Ser. Nos. 09/947,210, and 09/922,358, pending, each of which are incorporated herein by reference. The entire optoelectronic component can be further packaged within a sleeve of the nature described in co-pending application Ser. No. 09/713,367 filed Nov. 14, 2000, now U.S. Pat. No. 6,497,518, which is also incorporated herein by reference.

In the embodiments described above, a single optical channel is provided. It should be apparent that the described dam structure can also readily be used to position multiple optical fibers in multi-channel devices including transceivers and multi-channel transmitters and detectors. By way of example, referring next to FIG. 4 an optoelectronic transceiver in accordance with another embodiment of the invention will be described. In this embodiment, the optical transceiver includes a multi-channel (in the illustrated embodiment a four channel) photonic transmitter device 250 and a multi-channel (again a four channel) photonic detector device 260. Each of the transmitter and detector devices 250, 260 have an associated array of four optical fibers. The standoff distances between the emitters 252 or photodetectors 262 and their respective optical fibers can be controlled by forming a plurality of dams as described above with respect to FIG. 1, or single dam techniques which may, for example, embody the entire photonic perimeter Generally, the height of the emitters and photodetectors associated with a single chip will be relatively constant across the surface of the device. Therefore, the dams associated with a particular device will typically be of substantially the same height. Thus, their volume can be determined just once per chip. Of course, this is not a requirement. If it were deemed desirable in a particular application, multiple desired dam height determinations could be calculated independently and the size of the dispensed dams could be varied accordingly.

Figure 4:
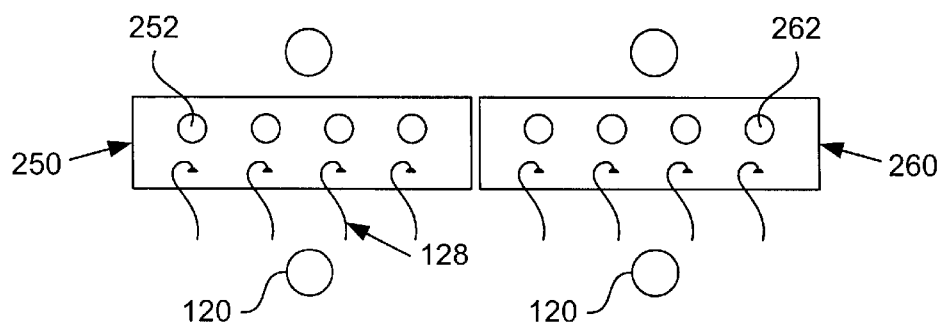
FIG. 4 is a diagrammatic top view of the optical interface region of a four channel multi-mode transceiver optoelectronic component having a first photonic device with an array of four emitter facets and a second photonic device with an array of four detector ports.

The illustrated transmitter device 250 has an array of four emitters 252 together with the drive circuitry required to drive the emitters to emit optical signals onto their associated optical fibers (not shown). The receiver device 260 has an array of four photodetectors and the drive circuitry required to receive signals from their associated optical fibers (not shown). Of course, the number of emitters or detectors on a particular device can be widely varied to meet the needs of a particular application. In many multi-channel applications, it is desirable to separate the emitters from the detectors in different chips as illustrated in FIG. 4. This is primarily due to the nature of electrical cross talk between the transmitter and detector circuitry. However, integrated transceivers can readily be provided as well.

In the embodiments illustrated above, the dams are somewhat ball shaped. However, it should be appreciated that when the nature of the material used to form the dam structure permits good control of the resultant dam height, the shape of the resultant dams can be widely varied. By way of example, rectangular footprints, ring shaped footprints, extended lines or arcs and numerous other dam shapes can be dispensed.

Figure 5:
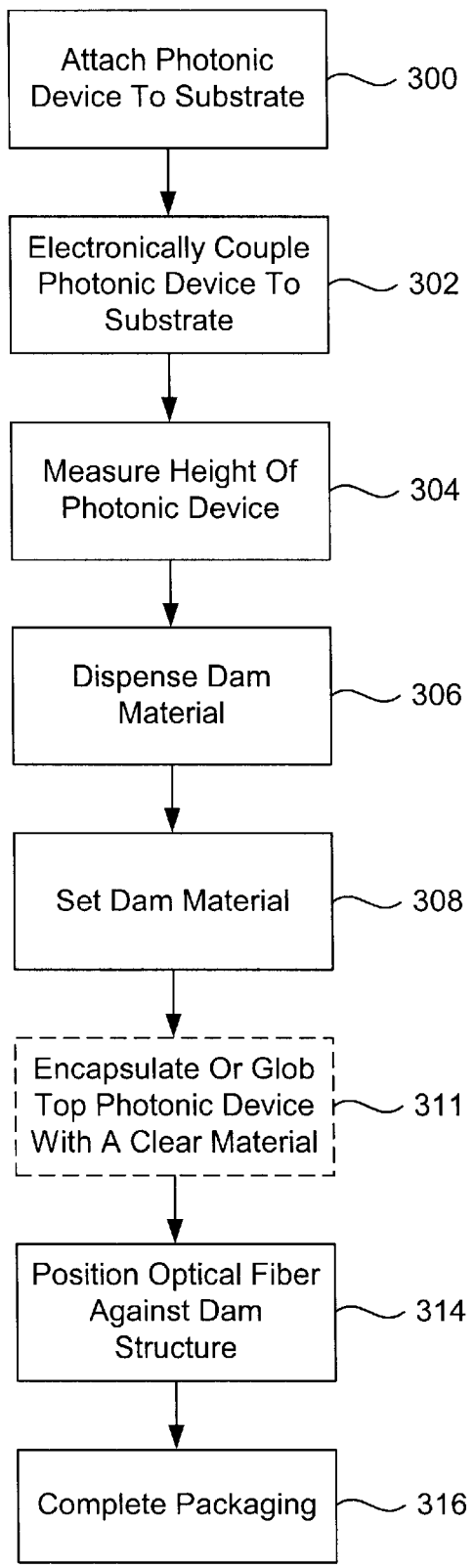
FIG. 5 is a flow chart illustrating a method of assembling a photonic device in accordance with one embodiment of the present invention.

The described optoelectronic packages can be assembled in a wide variety of manners. By way of example, on suitable method will be described with reference to FIG. 5. In the aspect relative to the present invention, the die is attached to a suitable substrate in step 300. The substrate can take any suitable form. In most cases, the substrate will have conductive elements thereon to facilitate electrically coupling the photonic device to other components or devices either inside or outside of the package. Any conventional die attachment arrangement can be utilized. In many situations, an adhesive is used to secure the die to the substrate. However, in the described embodiment, a cathode is provided on the back surface of the photonic device 110. In multi-channel devices, a common cathode may be provided. Therefore, the photonic device is soldered to a conductive cathode trace on the substrate. After the photonic device has been attached to the substrate, the anodes may be electrically connected in any conventional manner. Step 302. Of course, if the cathode were located on the top surface of the photonic device, it would need to be electrically connected as well. Today, wire bonding remains the most popular approach, although other approaches may be used as well.

If the photonic device has its active facets on one side and all of its electrical contacts on the other side, then the device may be flip chip mounted or a grid array package may be used to both mechanically and electrically couple the photonic device 110 to the substrate 108.

At some point after the die has been secured to the substrate, the height of the die 110 or its active facets may be measured relative to the substrate as represented by step 304. In the described embodiment, the height is measured after the photonic device has been electrically connected to the substrate. However, this is not a requirement. Although measuring the height of the die relative to the die is preferably done after the die is mounted, it should be appreciated that in most situations, the most significant variable will be the wafer thickness (as opposed to height variations due to soldering or adhesive bonding). Thus, in some embodiments it may be desirable to measure the die or wafer height prior to bonding in order to simplify the procedure.

Once the desired dam height is known, the appropriate volume to dispense can readily be calculated and the dam material dispensed(Step 306). The dam 120 is formed on the substrate 108. The actual location of the dam and its spacing relative to the photonic device may be widely varied based on the system deployed. In the illustrated embodiment, a single substantially ball shaped dam is deployed. However, in alternative embodiments, multiple dams or elongated or specially shaped dams may be dispensed.

A variety of commercially available microdispensers can be used to dispense the dam material. As discussed above a variety of materials can be used as the dam material. After the dam material is dispensed, it may be set using an appropriate technique such as snap curing(Step 308). The nature of the setting will depend on the material used. In the described embodiment, an epoxy resin is used as the dam material. As will be appreciated by those familiar with semiconductor packaging, UV light or heat are typically used to quickly cure (e.g. snap cure) epoxy materials in semiconductor applications.

After the dam is set, it may be desirable to glob top or encapsulate the photonic device with a transparent material to protect the device. This step 311 is entirely optional and will be omitted in many (and possibly most) applications. Some of the potential advantages of such an approach are discussed in co-pending application Ser. Nos. 09/922,946, pending, and 09/957,936, pending, each of which are incorporated herein by reference.

After the dam has been formed, an optical fiber is positioned relative to the dam such that the dam acts as a registration surface (Step 314). In some embodiments (such as the embodiment illustrated in FIG. 1), the cladding portion of the optical fiber itself will be brought into registration with the dam. However, in many applications (and particularly devices which have multiple channels) it is common to provide a fiber array termination or a ferrule at the end of the optical fibers to facilitate handling. In these applications, it will generally be preferable (although not required) to have the fiber termination register against the dam 120. When packaging larger multi-channel photonic devices in systems that use fiber array termination to group a plurality of fibers together, it may be desirable to provide multiple dams to better prevent torquing of the fiber arrays. When packaging multi-channel devices where the fibers are brought in independently, it may be necessary to provide multiple and/or elongated dams such that each fiber can be brought into contact with a dam independently.

After the optical fibers (or fiber arrays) have been positioned, the remainder of the packaging and testing may be completed in a conventional manner(Step 316). The actual steps employed may vary widely based on the particular system being packaged. Of course, in many applications additional preparatory and/or intermediate steps will be performed during the assembly of a particular package. Additionally, although the described method has been described in a sequential manner, it should be appreciated that in many instances, the order of the various steps can be varied and some of the described steps combined or eliminated.

Although only a few embodiments of the present invention have been described in detail, it should be understood that the present invention may be embodied in many other specific forms without departing from the spirit or scope of the invention. Particularly, it should be apparent that the described dam structures can readily be applied to a wide variety of photonic devices to provide a precise standoff distance for their associated optical fibers. The geometry, position and size of the dispensed dam may readily be adjusted to meet the needs of a particular application. As discussed in more detail in one of the related applications it may be desirable to construct a particular dam structure in order to address other packaging issues such as optical reflectance and/or to contain a sealing overmolding material.

The described dams can readily be applied to both single channel devices and multi-channel devices. They can be used to register free fiber tips, or to register a fiber termination such as a fiber array termination or a ferrule. Therefore, the present examples are to be considered as illustrative and not restrictive, and the invention is not to be limited to the details given herein, but may be modified within the scope of the appended claims.

What is claimed is:

1. An optoelectronic package comprising:

a base substrate;

a photonic device carried by the base substrate, the photonic device having an active facet thereon;

an optical fiber in optical communication with the facet on the photonic device; and a dam structure formed by dispensing a flowable material on the substrate and hardening the dispensed material, the dam structure being sized to define a desired standoff between the optical fiber and the photonic device.

2. An optoelectronic package as recited in claim 1 wherein the dam structure is formed by dispensing and curing an epoxy based material.

3. An optoelectronic package as recited in claim 1 wherein the substrate has electrically conductive traces thereon that are electrically connected to the photonic device.

4. An optoelectronic package as recited in claim 3 further comprising a semiconductor die in electrical communication with the photonic device through the conductive traces on the substrate.

5. An optoelectronic package as recited in claim 4 wherein the die is directly soldered to the substrate.

6. An optoelectronic package as recited in claim 3 wherein the substrate is formed from a flex material.

7. An optoelectronic package as recited in claim 6 further comprising an optical component support block that supports the flex material.

8. An optoelectronic package as recited in claim 7 wherein the photonic device has at least one bond pad thereon, the bond pad being electrically connected to an associated conductive trace on the substrate by a bonding wire.

9. An optoelectronic package as recited in claim 8 wherein the bonding wire is stitch bonded to the bond pad and ball bonded to the associated conductive trace.

10. An optoelectronic package as recited in claim 1 wherein the dam structure directly contacts a cladding portion of the optical fiber.

11. An optoelectronic package as recited in claim 1 further comprising a fiber termination that supports a distal end of the optical fiber, wherein the dam structure directly contacts the fiber termination.

12. An optoelectronic package as recited in claim 1 wherein a plurality of dam structures are provided.

13. An optoelectronic package as recited in claim 1 wherein the optical fiber has a chamfered distal surface.

14. An optoelectronic package as recited in claim 1 wherein the photonic device has a plurality of facets, the package comprising a plurality of said dam structures and a plurality of optical fibers, wherein each optical fiber has at least one associated dam structure.

15. An optoelectronic package as recited in claim 1 wherein the dam structure is formed by dispensing a thermoset plastic or a silicone gel.

16. An optoelectronic package as recited in claim 1 wherein the dam structure is configured to define a desired angle between the optical fiber and the photonic device.

17. An optoelectronic package as recited in claim 1 wherein the dam structure completely surrounds the photonic device.

18. An optoelectronic package comprising:
    a base substrate having at least one electrically conductive trace thereon;
    a photonic device carried by the base substrate, the photonic device having an active facet and at least one bond pad thereon;
    at least one reverse bonded bonding wire, each reverse bonded bonding wire being ball bonded to an associated conductive trace on the base substrate and stitch bonded to an associated bond pad;
    an optical fiber in optical communication with the facet on the photonic device; and
    a dam structure formed on the base substrate, the dam structure being sized to define a desired standoff between the optical fiber and the photonic device.

19. An optoelectronic package as recited in claim 18 wherein the dam structure is formed by dispensing and curing an epoxy based material.

20. An optoelectronic package as recited in claim 18 wherein the base substrate is a flex cable.

21. An optoelectronic package as recited in claim 18 wherein the dam structure directly contacts one of a cladding portion of the optical fiber or a ferrule that is attached to the optical fiber.

22. An optoelectronic package as recited in claim 18 wherein the photonic device has a plurality of facets, the package comprising a plurality of said dam structures and a plurality of optical fibers, wherein each optical fiber has at least one associated dam structure.

23. An optoelectronic component comprising:
    a flexible base substrate having at least one electrically conductive trace thereon;
    an optical component support block that supports the flexible base substrate;
    a photonic device mounted on the base substrate, the photonic device having an active facet thereon;
    an optical fiber in optical communication with the facet on the photonic device; and
    a dam structure formed by dispensing a flowable material on the base substrate and hardening the dispensed material, the dam structure being sized to define a desired standoff between the optical fiber and the photonic device.

24. An optoelectronic package as recited in claim 23 wherein the photonic device has at least one bond pad thereon, the bond pad being electrically connected to an associated conductive trace on the substrate by a bonding wire.

25. An optoelectronic package as recited in claim 23 wherein a plurality of dam structures is provided.

26. A method of packaging an optoelectronic device comprising:
    attaching a photonic device directly or indirectly to a base substrate;
    forming a registration dam on the base substrate by dispensing an accurate volume of a flowable material on the base substrate and hardening the dispensed material to form the registration dam; and
    positioning an optical fiber over the photonic device such that the registration dam sets a desired optical standoff distance between an active facet of the photonic device and the optical fiber.

27. A method as recited in claim 26 further comprising wire bonding at least one bond pad on the photonic device to an associated trace on the base substrate, the height of the registration dam being sufficiently high to prevent the optical fiber from contacting a bonding wire formed by the wire bonding.

28. A method as recited in claim 27 wherein the wire bonding is reverse wire bonding.

29. A method as recited in claim 26 wherein the registration dam is brought into direct contact with one of a cladding portion of the optical fiber or a fiber termination that carries the optical fiber.

30. A method as recited in claim 26 further comprising forming at least one additional registration dam on the base substrate, wherein each additional registration dam is formed by dispensing an additional accurate volume of the flowable material on the base substrate and hardening the dispensed additional flowable material.

31. A method as recited in claim 26 wherein the dispensed flowable material is an epoxy based material and the hardening is accomplished by curing the epoxy based material.

32. A method as recited in claim 26 wherein the dam structure is snap cured by exposing the dispensed flowable material to one of ultraviolet light or heat.

33. A method of packaging an optoelectronic device comprising:

attaching a photonic device to a base substrate;

forming a registration dam on the base substrate by dispensing an accurate volume of a flowable epoxy based material on the base substrate and curing the dispensed material to form the registration dam;

reverse wire bonding at least one bond pad on the photonic device to an associated trace on the base substrate, the height of the registration dam being sufficiently high to prevent the optical fiber from contacting a bonding wire formed by the wire bonding; and positioning an optical fiber over the photonic device such that the registration dam sets a desired optical standoff distance between an active facet of the photonic device and the optical fiber.

34. A method as recited in claim 33 further comprising forming at least one additional registration dam on the base substrate, wherein each additional registration dam is formed by dispensing an additional accurate volume of the epoxy based material on the base substrate and hardening the dispensed additional material.

* * * * *